United States Patent
Briggs et al.

(10) Patent No.: US 7,544,521 B1
(45) Date of Patent: Jun. 9, 2009

(54) NEGATIVE BIAS CRITICAL DIMENSION TRIM

(75) Inventors: Scott Briggs, Menlo Park, CA (US); Aaron Eppler, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 165 days.

(21) Appl. No.: 11/519,384

(22) Filed: Sep. 11, 2006

(51) Int. Cl.
*H01L 21/311* (2006.01)
*H01L 21/66* (2006.01)

(52) U.S. Cl. .............................. 438/9; 438/587; 430/30; 257/E21.027; 257/E21.039; 257/E21.36

(58) Field of Classification Search .................. 430/30, 430/313, 317, 318; 438/9, 587; 257/E21.027, 257/E21.039, E21.236
See application file for complete search history.

(56) References Cited

U.S. PATENT DOCUMENTS

| | | | |
|---|---|---|---|
| 5,926,690 A * | 7/1999 | Toprac et al. ................. | 438/17 |
| 6,492,272 B1 * | 12/2002 | Okada et al. ................. | 438/690 |
| 6,500,755 B2 | 12/2002 | Dakshina-Murthy et al. | |
| 6,790,782 B1 | 9/2004 | Yang et al. | |
| 2002/0045331 A1 * | 4/2002 | Aminpur ..................... | 438/585 |
| 2002/0061652 A1 * | 5/2002 | Tamaki et al. ................ | 438/694 |
| 2003/0219683 A1 * | 11/2003 | Nagarajan et al. ........... | 430/296 |
| 2004/0038139 A1 * | 2/2004 | Mui et al. ..................... | 430/30 |
| 2005/0064719 A1 * | 3/2005 | Liu et al. ..................... | 438/725 |
| 2008/0057729 A1 * | 3/2008 | Shen et al. ................... | 438/735 |

* cited by examiner

*Primary Examiner*—George Fourson
(74) *Attorney, Agent, or Firm*—Beyer Law Group LLP

(57) ABSTRACT

A method of trimming the critical dimension of an isolated line to a greater extent than a dense line is provided. A mask is formed of an organic material over the etch layer wherein the mask has at least a first region with a first pattern density and a second region with a second pattern density. A surface area of the organic material in the first region is measured. A surface area of the organic material in the second region is measured. A reverse bias trim of the mask is provided, wherein a ratio of a trim rate of the organic material in the first region to a trim rate of the organic material in the second region is related to a ratio of the measured surface area of the organic material in the first region to the measured surface area of the organic material in the second region.

12 Claims, 8 Drawing Sheets

NEGATIVE BIAS CRITICAL DIMENSION TRIM

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Various generations of photoresist are known. The photoresist patterns have a critical dimension (CD), which may be the width of the smallest feature. Due to optical properties dependent on wavelength, photoresist exposed by longer wavelength light has larger theoretical minimal critical dimensions. Features are etched through the photoresist pattern. Ideally, the CD of the features (the width of the features) is equal to the CD of the feature in the photoresist. In practice, the CD of the feature may be larger than the CD of the photoresist due to faceting, erosion of the photoresist, or undercutting. The feature may also be tapered, where the CD of the feature is at least as great as the CD of the photoresist, but where the feature tapers to have a smaller width near the feature bottom. Such tapering may provide unreliable features.

In order to provide features with smaller CD, features formed using shorter wavelength light are being pursued. 193 nm photoresist is exposed by 193 nm light. Using phase shift reticles and other technology, a 90-100 nm CD photoresist pattern may be formed, using 193 nm photoresist. This would be able to provide a feature with a CD of 90-100 nm. 157 nm photoresist is exposed by 157 nm light. Using phase shift reticles and other technology, sub 90 nm CD photoresist patterns may be formed. This would be able to provide a feature with a sub 90 nm CD.

The use of shorter wavelength photoresists may provide additional problems over photoresists using longer wavelengths. To obtain CD's close to the theoretical limit the lithography apparatus should be more precise, which would require more expensive lithography equipment. Presently 193 nm photoresist and 157 nm photoresist may not have selectivities as high as longer wavelength photoresists and may more easily deform under plasma etch conditions.

SUMMARY OF THE INVENTION

To achieve the foregoing and in accordance with the purpose of the present invention a method of trimming the critical dimension of an isolated line to a greater extent than a dense line is provided. A mask is formed of an organic material over the etch layer wherein the mask has at least a first region with a first pattern density and a second region with a second pattern density. A surface area of the organic material in the first region is measured. A surface area of the organic material in the second region is measured. A reverse bias trim of the mask is provided, wherein a ratio of a trim rate of the organic material in the first region to a trim rate of the organic material in the second region is related to a ratio of the measured surface area of the organic material in the first region to the measured surface area of the organic material in the second region.

In another manifestation of the invention a method of trimming the critical dimension of an isolated line to a greater extent than a dense line is provided. A mask of an organic material is formed over the etch layer wherein the mask has at least a first region with a first pattern density and a second region with a second pattern density different than the first density. A reverse bias trim of the mask is provided. The etch layer is etched through the trimmed mask.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In etching a dielectric feature, a CD (critical dimension) bias towards isolated features may occur during the etching. Such a bias causes the enlargement of CD of etched features in isolated regions over etched features in regions that are denser with features.

Figure 1:
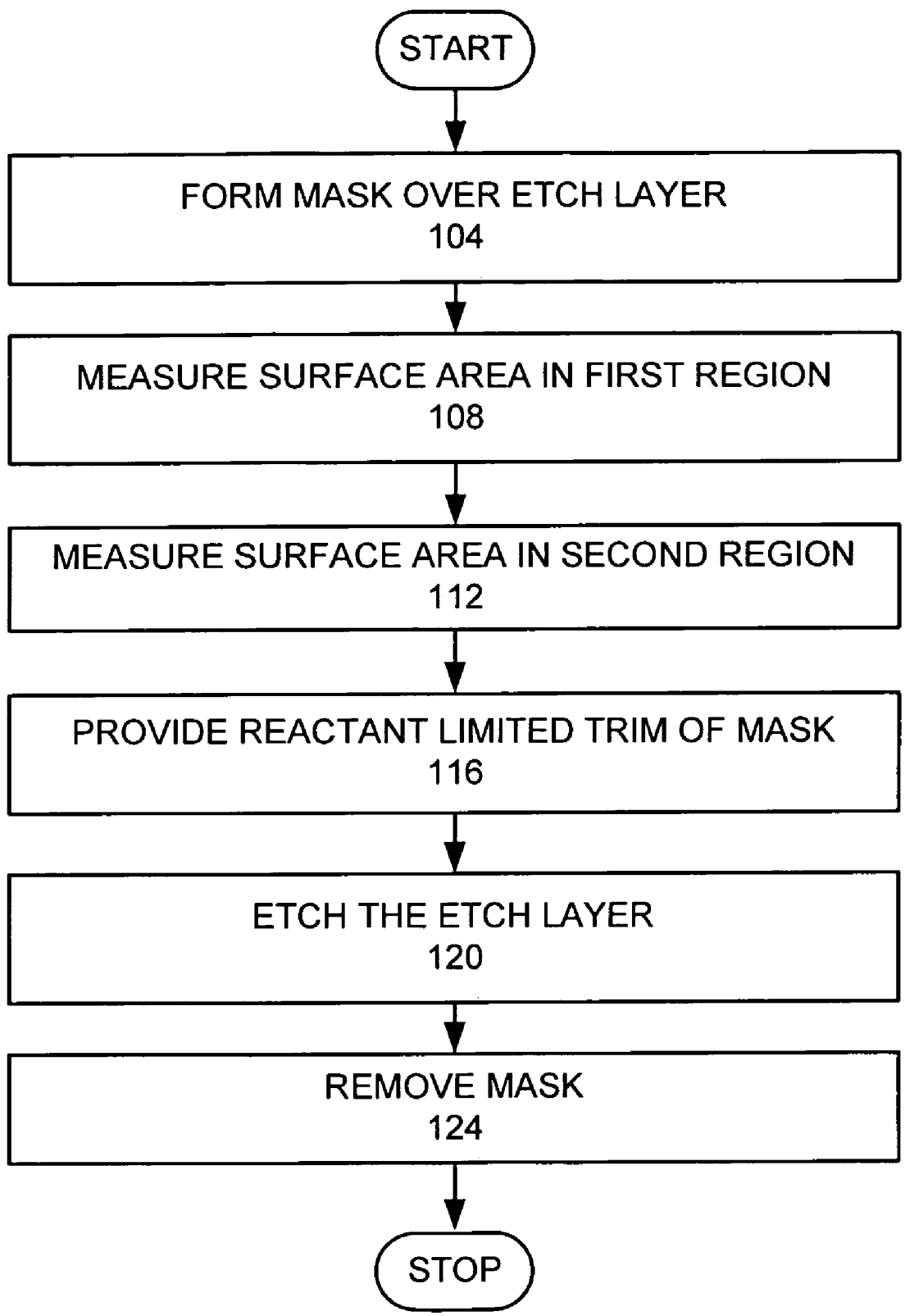
FIG. 1 is a flow chart of a process that may be used in an embodiment of the invention.

To facilitate understanding, FIG. 1 is a flow chart of a process that may be used in an embodiment of the invention. A mask is formed over an etch layer of a material (step 104). A mask surface area in a first region is measured (step 108). A mask surface area in a second region is measured (step 112). The mask is trimmed with a reverse bias trim with a negative critical dimension bias towards isolated areas (step 116).

Without being bound by theory, it is believed that the reverse bias trim with a negative critical dimension bias towards isolated areas limits the reactant so that denser areas with more organic material that would react with the reactant use up the limited reactant thus etching slower, while more isolated areas do not use up reactant and therefore are trimmed more quickly. It is also believed that the ratio of the trim rate of the organic material in the first region to the trim rate of the organic material in a second region is related to the ratio between the measured surface area of the organic material in the first region to the surface area of the organic material in the second region. To provide such a trim, the etch layer or an intermediate layer between the mask and etch layer acts as an etch stop.

The etch layer is etched through the mask (step 120). In one embodiment, the etch has a positive critical dimension bias towards isolated regions. The positive critical dimension bias towards isolated regions of the etch tends to enlarge the critical dimension of isolated features, which in the specification and claims is defined as a forward bias. The mask is removed (step 124).

Figure 2:
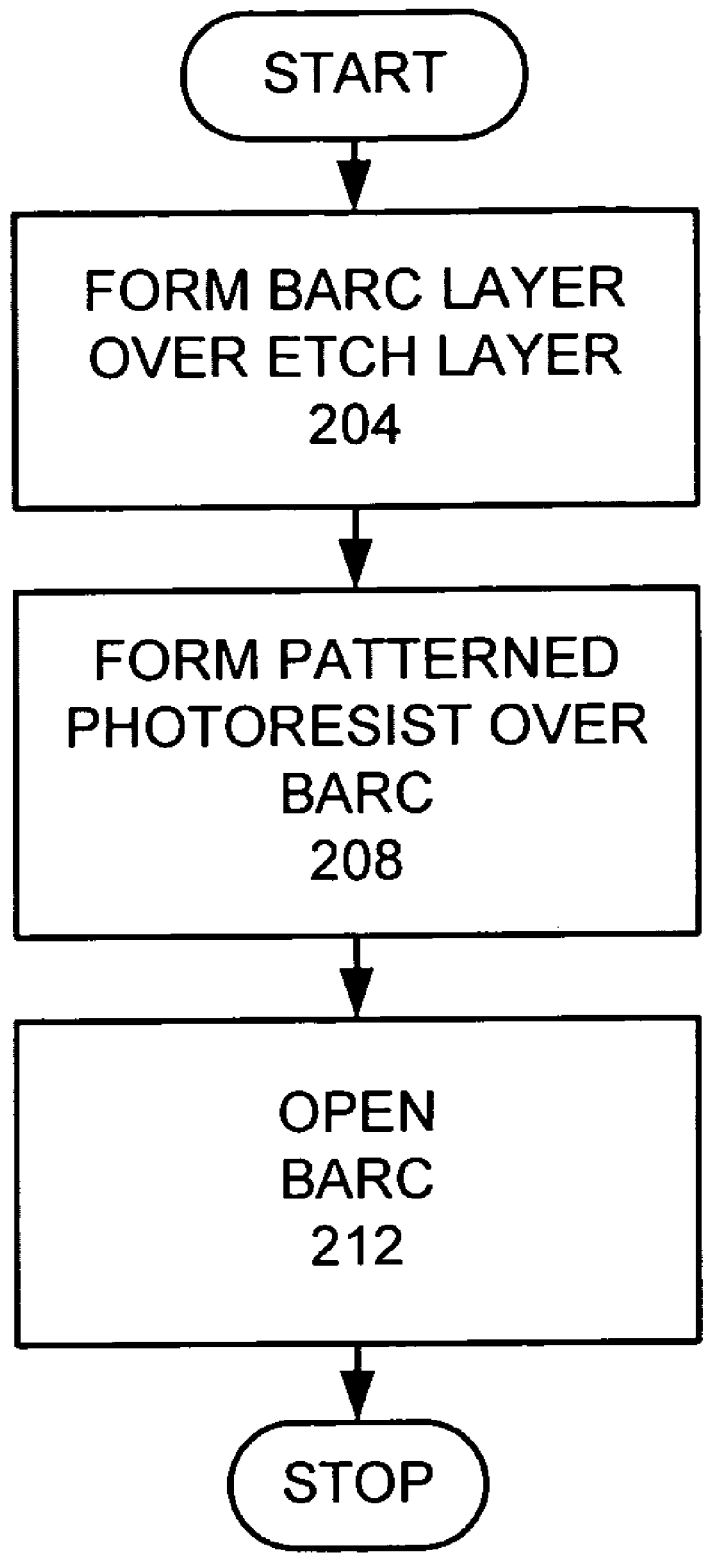
FIG. 2 is a more detailed flow chart of a step of forming a mask over the etch layer.
Figure 3A:
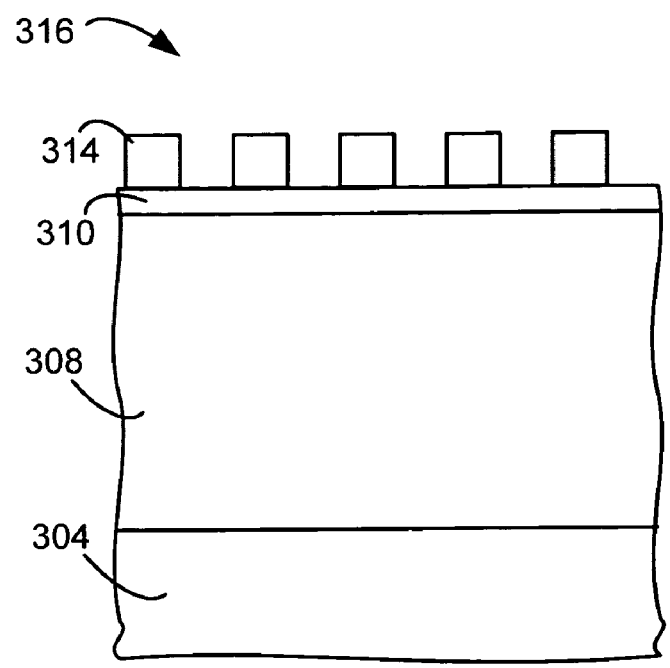
FIGS. 3A-B are schematic cross-sectional and top views of a wafer under an etch layer over which a BARC is formed for a densely patterned region and isolated patterned region, respectively.
Figure 3B:
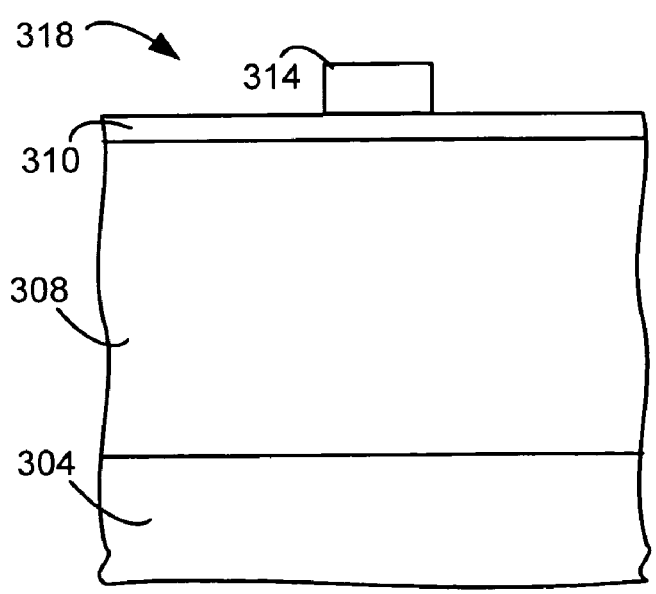

In a preferred embodiment of the invention, the mask is an organic material, which is preferably photoresist, BARC, or amorphous carbon or a combination thereof which is formed over an etch layer of an inorganic material, such as silicon nitride (step 104). FIG. 2 is a more detailed flow chart of a step of forming a mask over the etch layer (step 104). A BARC (Bottom Antireflective Coating) is formed over an etch layer (step 204). FIGS. 3A and 3B are cross sectional views of parts of a wafer 304 under an etch layer 308 over which a BARC 310 is formed. A patterned photoresist mask 314 is formed over the BARC 310 (step 208). The patterned photoresist mask 314 has a densely patterned region 316, as shown in FIG. 3A and isolated patterned region 318, as shown in FIG. 3B. Other layers may be placed between the BARC and etch layer, as will be described below.

Figure 4:
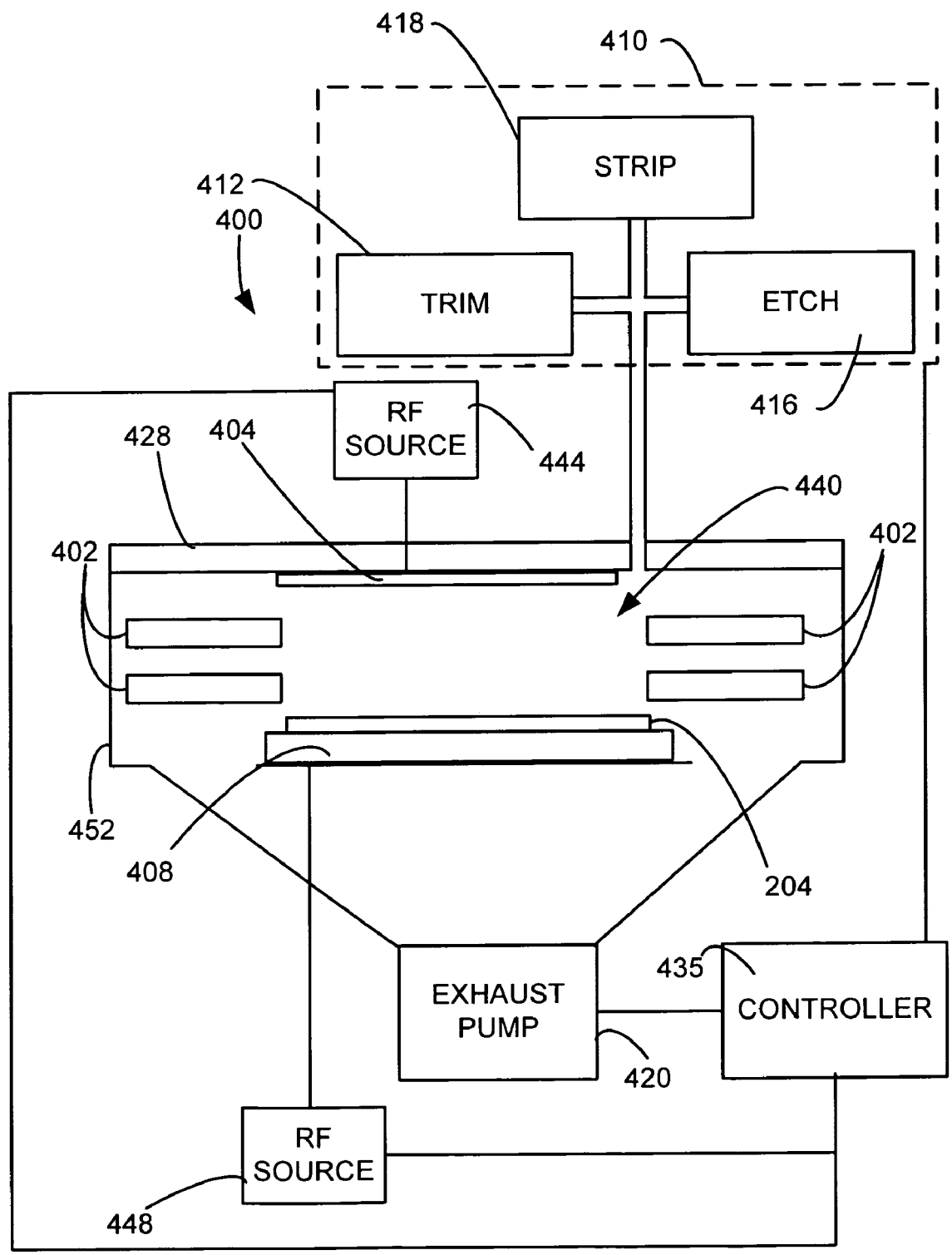
FIG. 4 is a schematic view of a plasma processing chamber that may be used in practicing the invention.

The wafer 304 may be put in a plasma processing chamber. FIG. 4 is a schematic view of a processing chamber 400 that may be used in this embodiment. The plasma processing chamber 400 comprises confinement rings 402, an upper electrode 404, a lower electrode 408, a gas source 410, and an exhaust pump 420. The gas source comprise gas sources such as a trim gas source 412, and etch gas source 416, and a stripping gas source 418 to allow trimming, etching, stripping, and other processes to be performed in the same chamber. Within plasma processing chamber 400, the substrate 304 is positioned upon the lower electrode 408. The lower electrode 408 incorporates a suitable substrate chucking mechanism (e.g., electrostatic, mechanical clamping, or the like) for holding the substrate 304. The reactor top 428 incorporates the upper electrode 404 disposed immediately opposite the lower electrode 408. The upper electrode 404, lower electrode 408, and confinement rings 402 define the confined plasma volume 440. Gas is supplied to the confined plasma volume by the gas source 410 and is exhausted from the confined plasma volume through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source and a 2 MHz power source. Different combinations of connecting RF power to the electrode are possible. In the case of Lam Research Corporation's Dual Frequency Capacitive (DFC) System, made by Lam Research Corporation™ of Fremont, Calif., which may be used in a preferred embodiment of the invention, both the 27 MHz and 2 MHz power sources make up the second RF power source 448 connected to the lower electrode, and the upper electrode is grounded. In other embodiments, the RF power source may have a frequency up to 300 MHz. A controller 435 is controllably connected to the RF sources 444, 448, exhaust pump 420, and the gas source 410. The DFC System would be used when the layer to be etched 308 is a dielectric layer, such as silicon oxide or organo silicate glass.

Figure 5A:
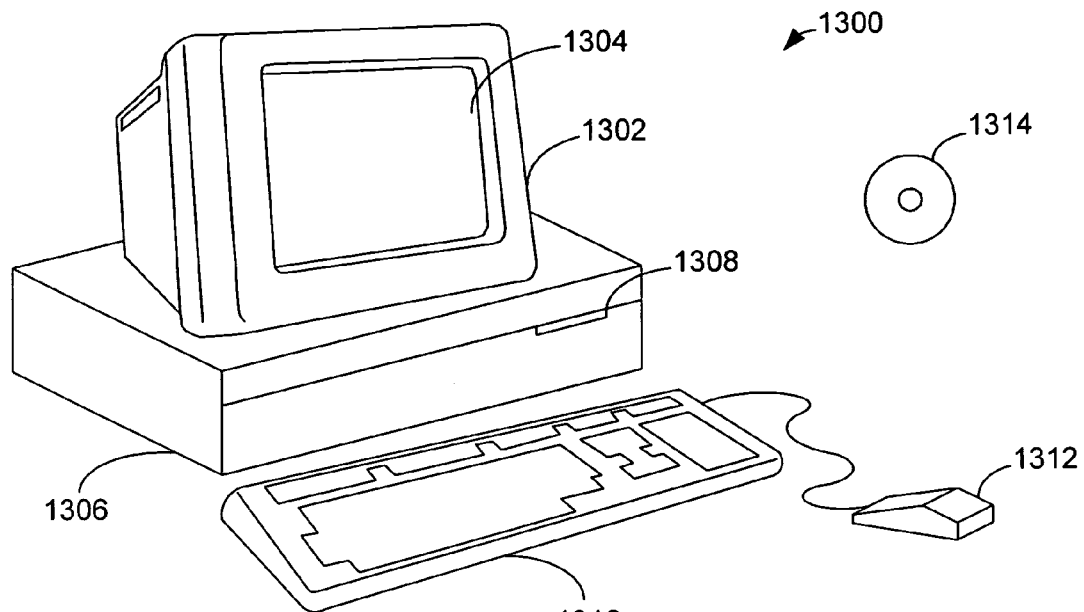
FIGS. 5A-B illustrate a computer system, which is suitable for implementing a controller used in embodiments of the present invention.
Figure 5B:
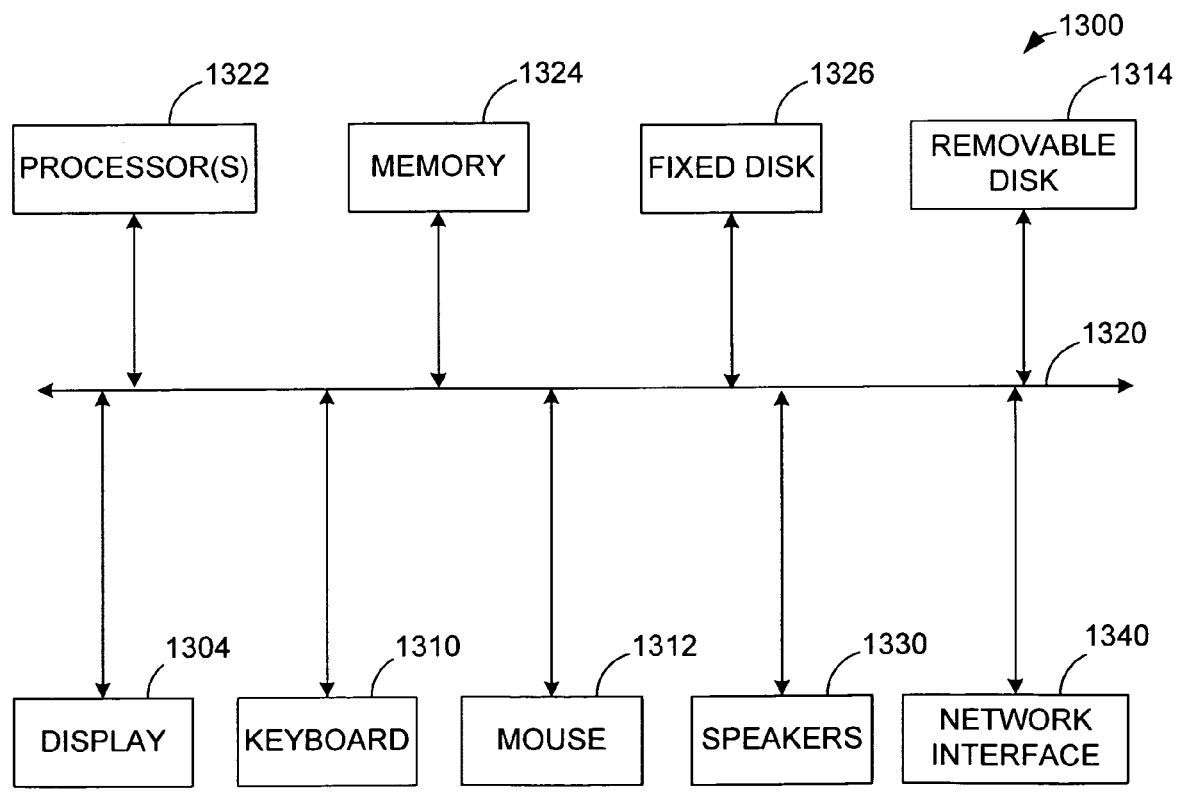

FIGS. 5A and 5B illustrate a computer system 1300, which is suitable for implementing a controller 435 used in embodiments of the present invention. FIG. 5A shows one possible physical form of the computer system. Of course, the computer system may have many physical forms ranging from an integrated circuit, a printed circuit board, and a small hand-held device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 5B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312, and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The BARC is opened (step 212). A conventional BARC open etch may be used to open the BARC 310. Generally, a BARC open gas of $CF_4$ and $O_2$ is provided. The gas is energized to create a plasma from the BARC open gas to etch the BARC. The BARC open gas is then stopped.

Figure 6A:
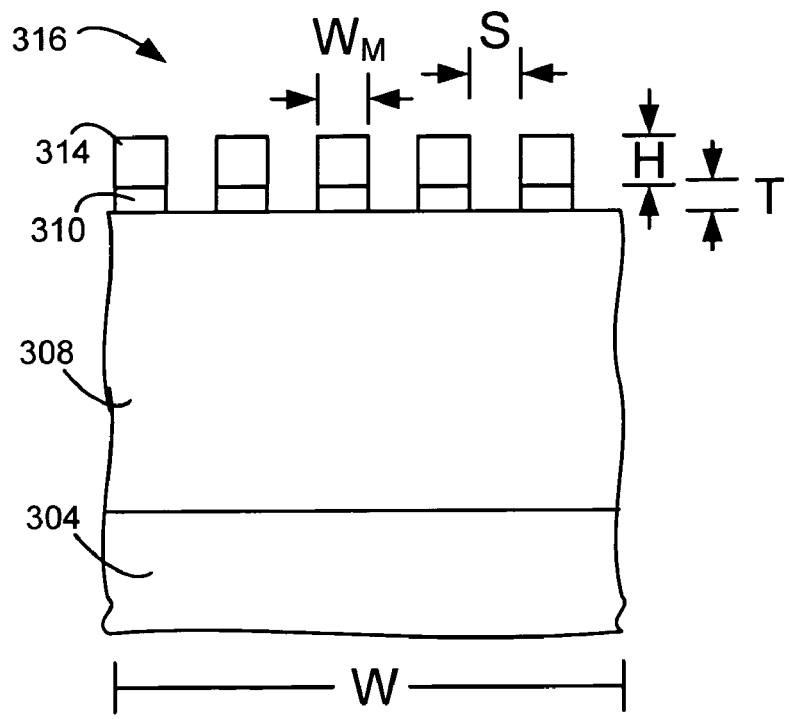
FIGS. 6A-B are cross-sectional views of the substrate after the BARC open for the densely patterned region and the isolated patterned region, respectively.
Figure 6B:
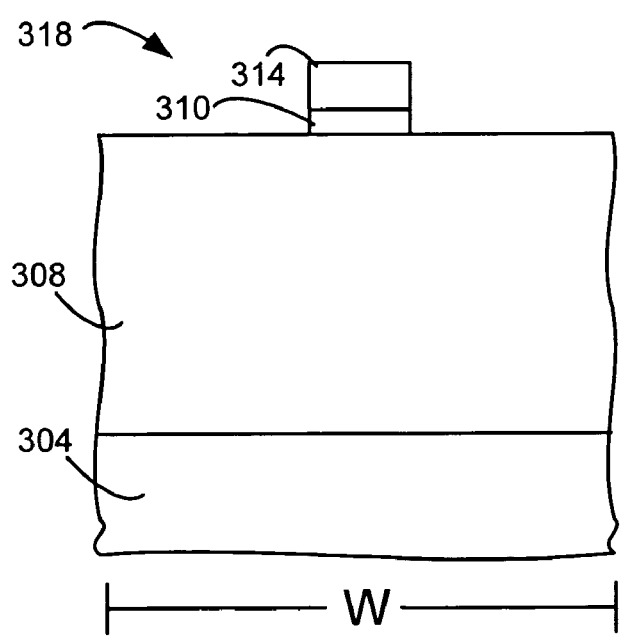

The surface area of the first region is measured (step 108). In this example the surface area of the organic material, which is the photoresist 314 and BARC 310 is measured. For 1000 nm wide regions (W), as shown in FIGS. 6A and 6B, for the densely patterned region 316, there are five mask lines in 1000 nm and for the isolated patterned regions 318 there is a single mask line in 1000 nm. Each region is measured 1000 nm thick into the page. In this example, each mask line has a width ($W_m$) of 100 nm and a height (H) of 100 nm. In this example, the BARC has a thickness (T) of 50 nm, so that the total height of the mask line and the BARC is 100 nm+50 nm=150 nm. In the densely patterned regions 316, the patterns 314 are spaced (S) 100 nm apart. Each pattern 314 has a surface area of (150 nm+150 nm+100 nm) 1000 nm=$4\times10^5$ $nm^2$. Five patterns 314 in the densely patterned regions 316 provide an organic material pattern of $5(4\times10^5 \, nm^2)=2\times10^6$ $nm^2$.

For the isolated patterned area, for a 1000 nm×1000 nm surface with one pattern 200 nm wide and a height of 100 nm, the BARC provides an additional height of 50 nm to make the total organic material height of 150 nm. The surface area of the organic material is (150 nm+200 nm+150 nm)1000 nm=$5\times10^5$ $nm^2$. Therefore, in this example the ratio of the surface area of the organic material in the dense area to the surface area of the organic material in the isolated area is 4:1.

The measured surface area in the first region and the measured surface area in the second region are used to determine the requirements for and results of a reverse bias trim of the mask. The mask is then subjected to a reverse bias trim (step 116).

A recipe for a reverse bias trim provides a chamber of 5-20 mTorr. 50-200 sccm Ar and 1-10 sccm $O_2$ are provided to the chamber. 100 Watts are provided at 27 MHz for a period of 30 seconds, which forms a plasma from the $O_2$ providing a plasma with oxygen species, where the oxygen species causes the trimming of the organic material. The process is then stopped.

In the preferred embodiment, the flow of $O_2$ is between 0.5 sccm $O_2$ to 15 sccm $O_2$. More preferably, the flow of $O_2$ is between 1.0 sccm $O_2$ and 10 sccm $O_2$. In the preferred embodiment the ratio of the flow of Ar to the flow of $O_2$ is between 200:1 and 100:15. More preferably, the ratio of the flow of $O_2$ to the flow of Ar is between 100:1 and 100:10. In the preferred embodiment, the trim gas consists essentially of Argon and Oxygen.

More generally, the trim gas comprises an oxygen containing component. Preferably, the oxygen containing component is $O_2$.

Figure 7A:
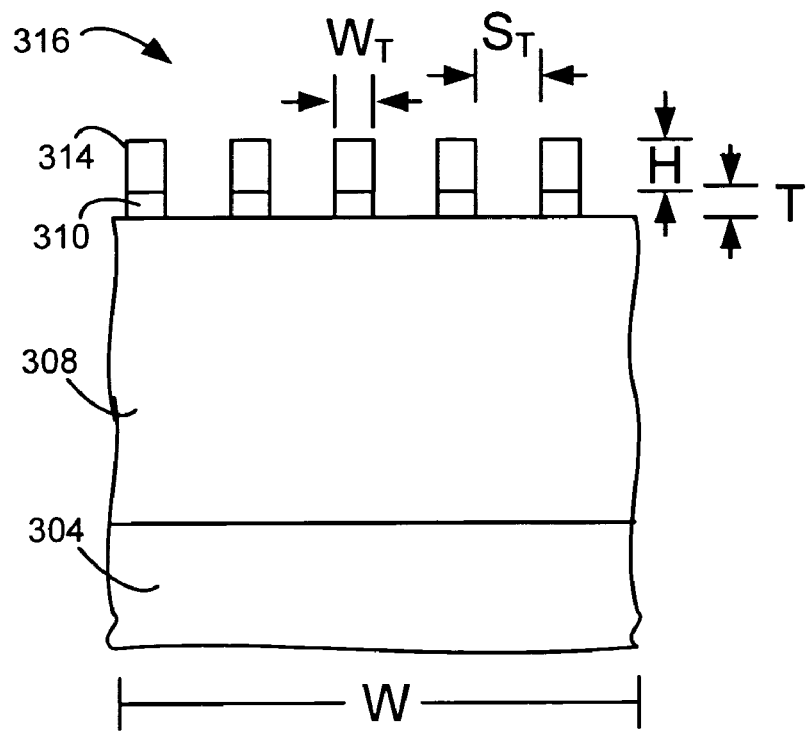
FIGS. 7A-B are cross-sectional views of the substrate after the reverse bias trim for the densely patterned region and the isolated patterned region, respectively.
Figure 7B:
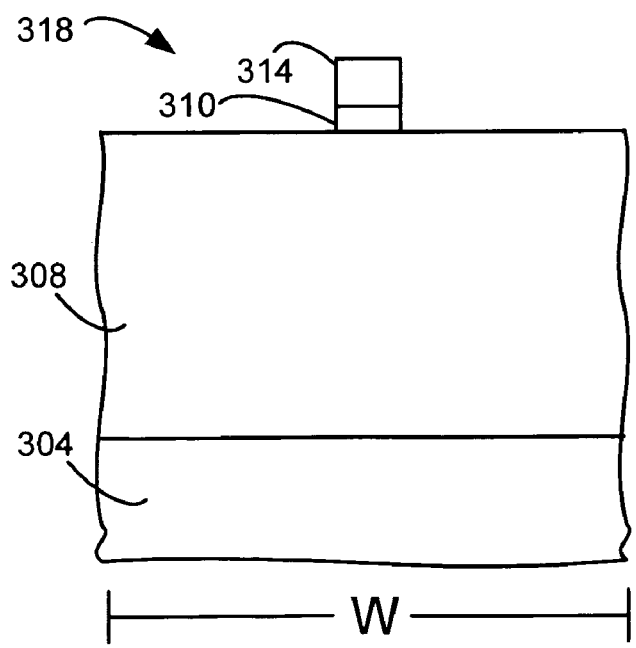

FIGS. 7A and 7B are cross-sectional views of the substrate after the reverse bias trim for the densely patterned region 316 and the isolated patterned region 318. It should be noted that the patterns 314 for the densely patterned regions 316 have less reduced width $W_T$ than the width reduction of the isolated patterned regions 318. This is negative critical dimension bias towards isolation.

For example the widths $W_M$ of the mask pattern in the dense region 316 may initially be 100 nm and the widths $W_M$ of the mask pattern in the isolated region 318 may initially be 100 nm. After the trim the widths $W_T$ of the mask pattern in the dense region 316 is 95 nm $\Delta t=-5$ nm, and the widths $W_T$ of the mask pattern in the isolated region 318 is 80 nm $\Delta t=-20$ nm. Therefore, in this example, the mask in the dense region was trimmed 5 nm and the mask in the isolated region was trimmed 20 nm, so that the mask in the isolated regions was trimmed 15 nm more than the mask in the dense regions. This is an example of a negative bias trim or reverse bias trim that has a negative critical dimension bias towards isolation.

The etch layer is etched (step 120). In this example, a conventional zero or positive critical dimension bias towards isolated areas is provided by the etch of the etch layer. Conventional dielectric inorganic material etches generally have such a forward bias etch, with typical etch gases of $CF_4$, $CHF_3$, and Ar.

Figure 8A:
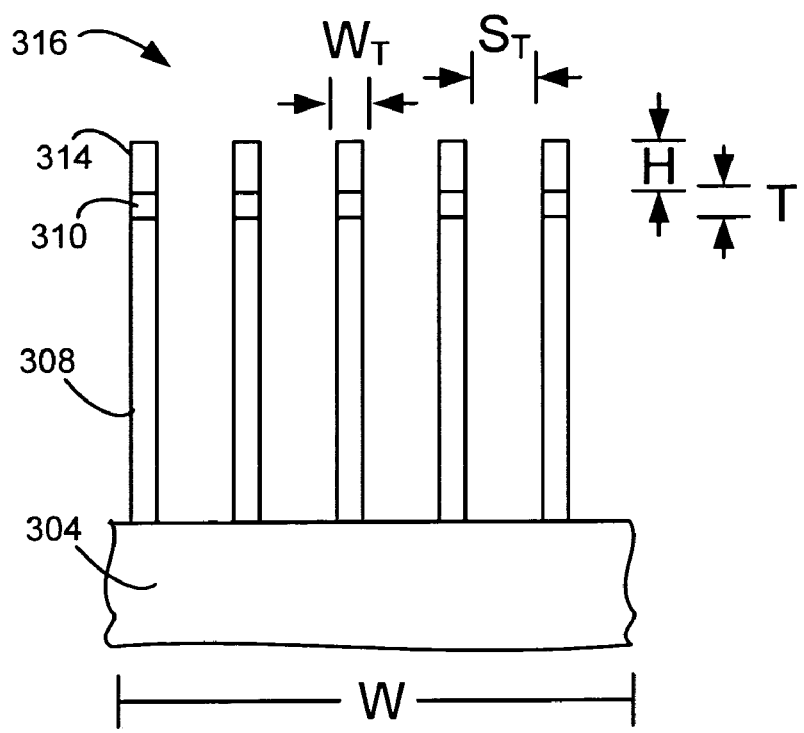
FIGS. 8A-B are cross-sectional views of the substrate after the dielectric layer etch for the densely patterned region and the isolated patterned region, respectively.
Figure 8B:
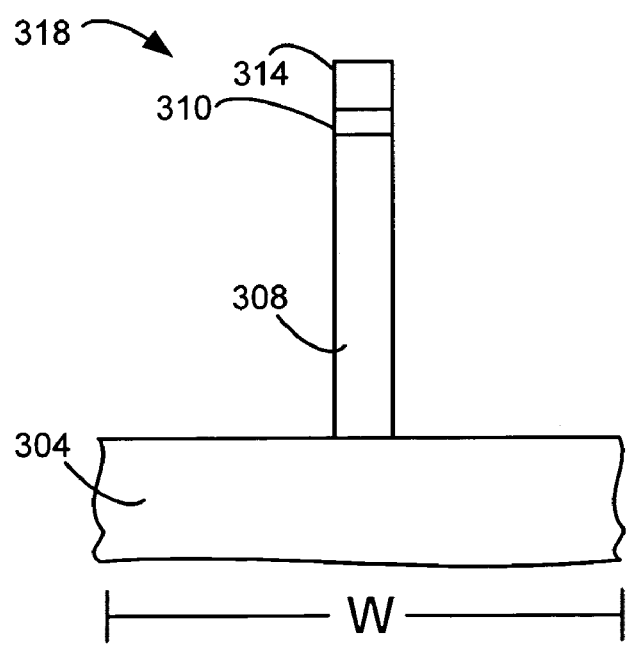

FIGS. 8A and 8B are cross-sectional views of the substrate after the dielectric layer etch for the densely patterned region 316 and the isolated patterned region 318. The features etched into the dielectric layer are enlarged more in the isolated patterned region 318 than in the densely patterned region 316, which is the positive critical dimension bias towards isolation. This means that for the width of the walls $W_T$ between the features 344 in the densely patterned region 316 are reduced less than the widths of the walls $W_T$ in the isolated regions. For example, the widths $W_T$ of the walls between the features 344 in the densely patterned region 316 are may be 95 nm before the etch and 75 nm after the etch for a $\Delta t=-20$ nm. Whereas the widths of the walls in the isolated pattern region 318 may be 80 nm before the etch and 76 nm after the etch with a $\Delta t=-5$ nm. Therefore, in this example, the widths of the walls in the dense regions were reduced by 20 nm and the widths of the walls in the isolated region were reduced 15 nm, so that the widths of the walls in the dense regions were reduced 15 nm more than the widths of the walls in the isolated regions. In this example the reverse bias of the trim may was used to compensate for the forward bias of the etch, so that the end result has no bias. In other embodiments, the reverse bias of the trim at least partially compensates for the forward bias of the etch.

The photoresist mask 314 and BARC 310 are then removed (step 124). This may be done using conventional ashing processes.

In other embodiments, the antireflective coating ARC may be provided by an inorganic material (DARC). In such a case, the reverse bias trim is preferably performed before the opening of the DARC. The BARC was opened before trim to expose the inorganic dielectric so that inorganic material is exposed. The DARC does not need to be opened before trimming, since the DARC is an exposed inorganic material.

Preferably, the etch layer is an inorganic dielectric layer such as silicon oxide. Generally, organic materials react with $O_2$ and inorganic materials do not react with $O_2$. In another embodiment the etch layer is an inorganic material that is used as an etch mask over another etch layer.

In one embodiment the etch layer may be disposed under an amorphous carbon layer, disposed under a silicon oxynitride layer, disposed under a BARC, which is under a PR mask. In such an embodiment, the trim may be after either the BARC or amorphous carbon open. If the trim is performed after the amorphous carbon open, the BARC and photoresist are removed during the amorphous carbon open, so the surface area of the amorphous carbon is used to determine the surface area of the organic material. In the specification and claims, amorphous carbon includes hydrogenated amorphous carbon, which gives the amorphous carbon the same properties as other organic material. In the specification and claims, organic materials include photoresist, BARC, amorphous carbon, and combinations thereof.

In other embodiments a forward bias etch may not be used. Instead, a reverse bias trim may be desired to obtain a desired mask pattern.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method of etching an etch layer of an inorganic material, comprising:
    forming a mask of an organic material over the etch layer wherein the mask has at least a first region with a first density and a second region with a second density;
    measuring a surface area of the organic material in the first region;
    measuring a surface area of the organic material in the second region;
    using the measured surface area of the organic material in the first region and the measured surface area of the organic material in the second region to determine requirements for a reverse bias trim of the mask; and
    providing a reverse bias trim of the mask, wherein a ratio of a trim rate of the organic material in the first region to a trim rate of the organic material in the second region is related to a ratio of the measured surface area of the organic material in the first region to the measured surface area of the organic material in the second region.

2. The method, as recited in claim 1, wherein the reverse bias trim, comprises:
    providing a trim gas comprising an oxygen containing gas; and
    converting the trim gas to a plasma.

3. The method, as recited in claim 2, further comprising:
    etching the etch layer through the trimmed mask; and
    removing the mask.

4. The method, as recited in claim 3, wherein the forming the mask comprises:
    forming a BARC layer over the etch layer;
    forming a photoresist layer over the BARC layer;
    patterning the photoresist layer; and
    opening the BARC layer.

5. The method, as recited in claim 4, wherein the etching of the etch layer has a forward bias towards etching isolated regions, wherein the reverse bias of the trim at least partially compensates the forward bias of the etch.

6. The method, as recited in claim 5, wherein the trim gas comprises Ar and $O_2$, wherein a ratio of a flow of Ar to a flow of $O_2$ is between 200:1 and 100:15.

7. The method, as recited in claim 6, wherein the trim gas consists essentially of Ar and $O_2$.

8. The method, as recited in claim 2, wherein the trim gas comprises Ar and $O_2$, wherein a ratio of a flow of Ar to a flow of $O_2$ is between 200:1 and 100:15.

9. The method, as recited in claim 8, wherein the trim gas consists essentially of Ar and $O_2$.

10. The method, as recited in claim 1, wherein the providing a reverse bias trim of the mask provides a reactant limited trim.

11. A semiconductor device formed by the method of claim 1.

12. The method, as recited in claim 1, wherein the using the measured surface area of the organic material in the first region and the measured surface area of the organic material in the second region comprises calculating the ratio of the surface area of the organic material in the first region and the surface area of the organic material in the second region.

* * * * *